United States Patent
Chang et al.

(10) Patent No.: US 11,350,546 B2
(45) Date of Patent: May 31, 2022

(54) SERVER WITH RECONFIGURABLE FRONT AND REAR ACCESS

(71) Applicant: QUANTA COMPUTER INC., Taoyuan (TW)

(72) Inventors: Chun Chang, Taoyuan (TW); Hsin-Chieh Lin, Taoyuan (TW); Yao-Long Lin, Taoyuan (TW); You-Jin Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 45 days.

(21) Appl. No.: 17/101,488

(22) Filed: Nov. 23, 2020

(65) Prior Publication Data

US 2022/0039294 A1 Feb. 3, 2022

Related U.S. Application Data

(60) Provisional application No. 63/060,411, filed on Aug. 3, 2020.

(51) Int. Cl.
*H05K 7/20* (2006.01)

(52) U.S. Cl.
CPC ............................... *H05K 7/20718* (2013.01)

(58) Field of Classification Search
CPC ............. H05K 7/1492; H05K 7/20754; H05K 7/1447; G06F 1/184; G06F 1/187; G06F 1/188; G06F 1/20; G06F 1/263; G06F 11/2015

See application file for complete search history.

(56) References Cited

U.S. PATENT DOCUMENTS

| | | | | |
|---|---|---|---|---|
| 8,787,014 B2* | 7/2014 | Zhang | .................. | G06F 1/20 174/547 |
| 2003/0039099 A1* | 2/2003 | Chen | .................. | G06F 1/184 361/727 |
| 2012/0134086 A1* | 5/2012 | Zhang | .................. | H05K 7/1487 361/679.02 |
| 2012/0218689 A1* | 8/2012 | Peng | .................. | H05K 7/1492 361/679.01 |
| 2015/0062798 A1* | 3/2015 | Kannler | .................. | H05K 7/20145 361/679.32 |
| 2016/0205803 A1* | 7/2016 | Zhu | .................. | H05K 7/1492 361/679.02 |
| 2018/0098455 A1* | 4/2018 | Nl | .................. | H05K 7/20754 |

\* cited by examiner

*Primary Examiner* — Abhishek M Rathod
(74) *Attorney, Agent, or Firm* — Nixon Peabody LLP

(57) ABSTRACT

A method for converting a computing device from a first configuration to a second configuration is provided. A power supply unit of the computing device is moved from a first location at a second end of the computing device to a second location at a first end of the computing device. The power supply unit is rotated such that a power interface of the power supply unit is visible from the first end of the computing device. A set of fans of the computing device is rotated such that airflow direction of the set of fans matches an airflow direction of the power supply unit at the second location. Converting the computing device from the first configuration to the second configuration can allow communication ports to be accessed from a front end or from a rear end of the computing device.

14 Claims, 12 Drawing Sheets

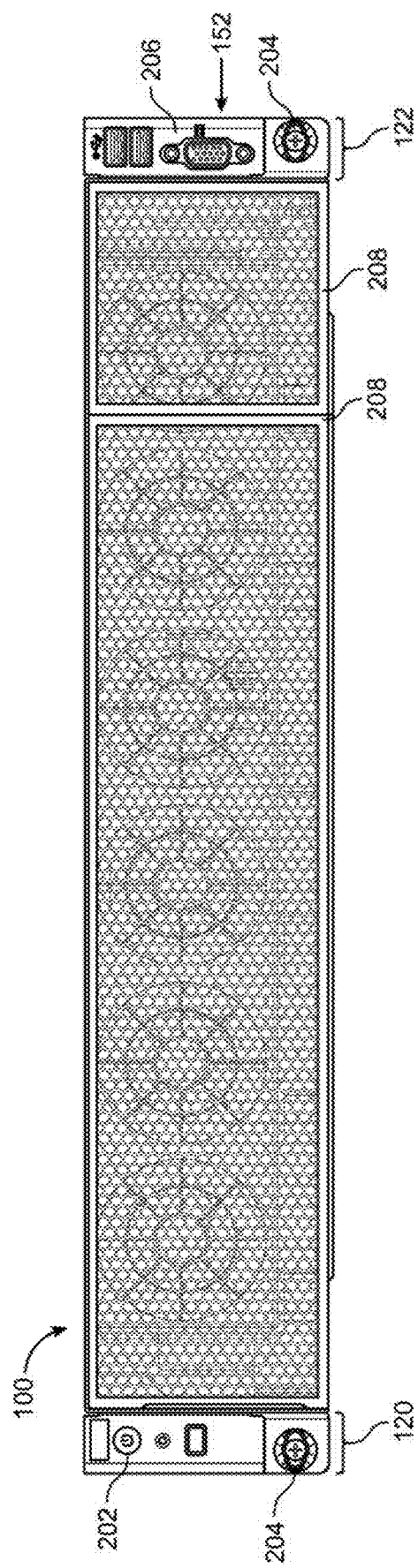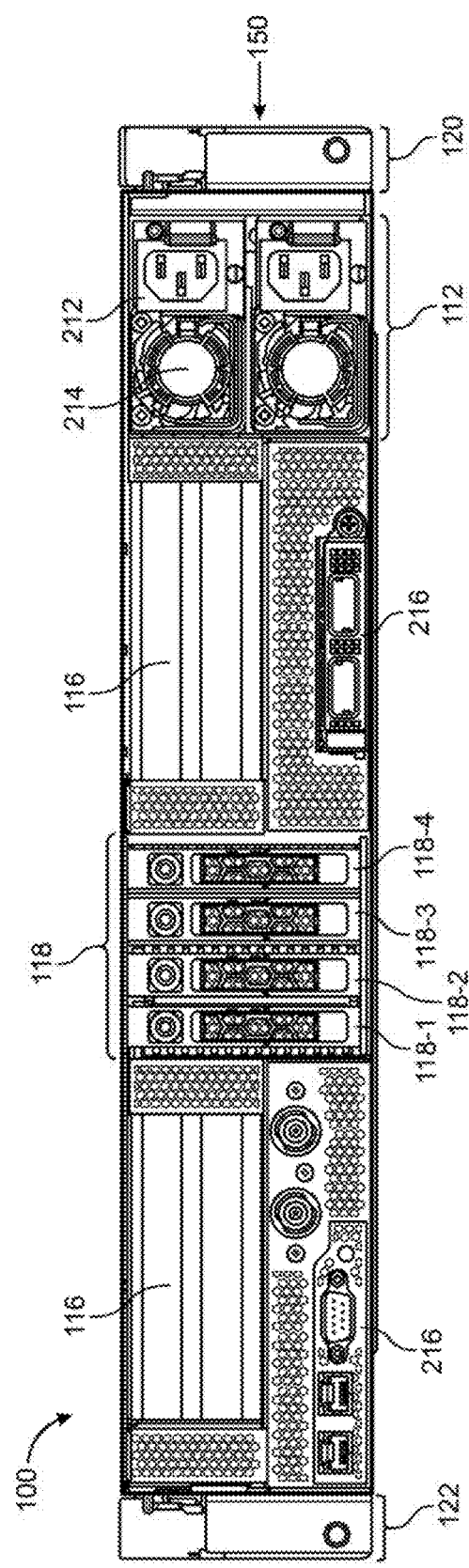
FIG. 2A
FIG. 2B

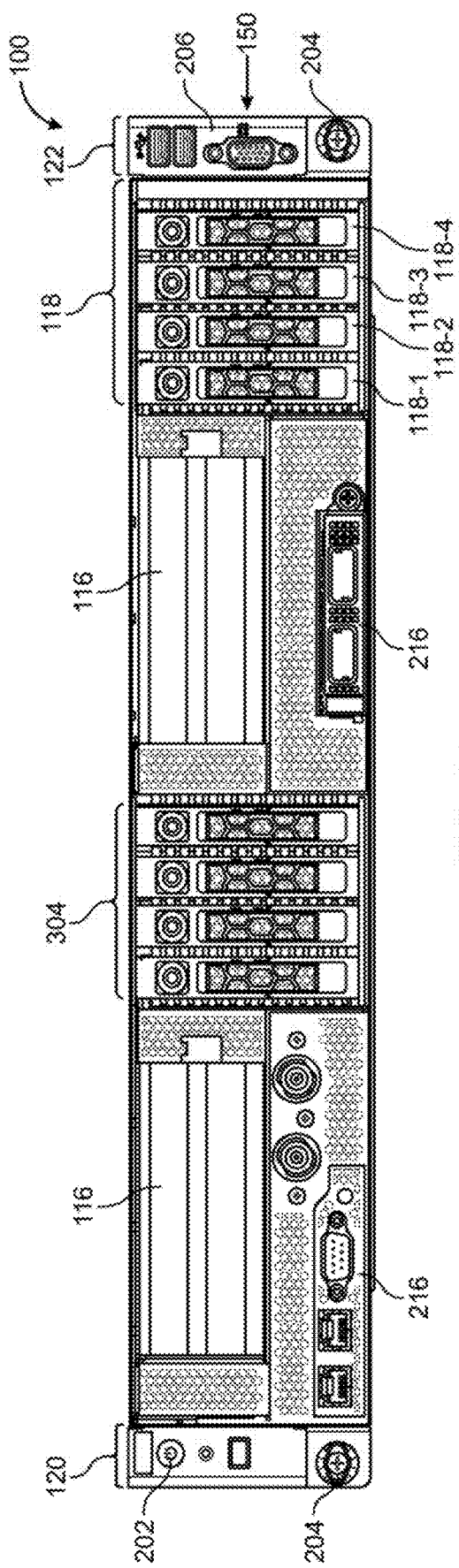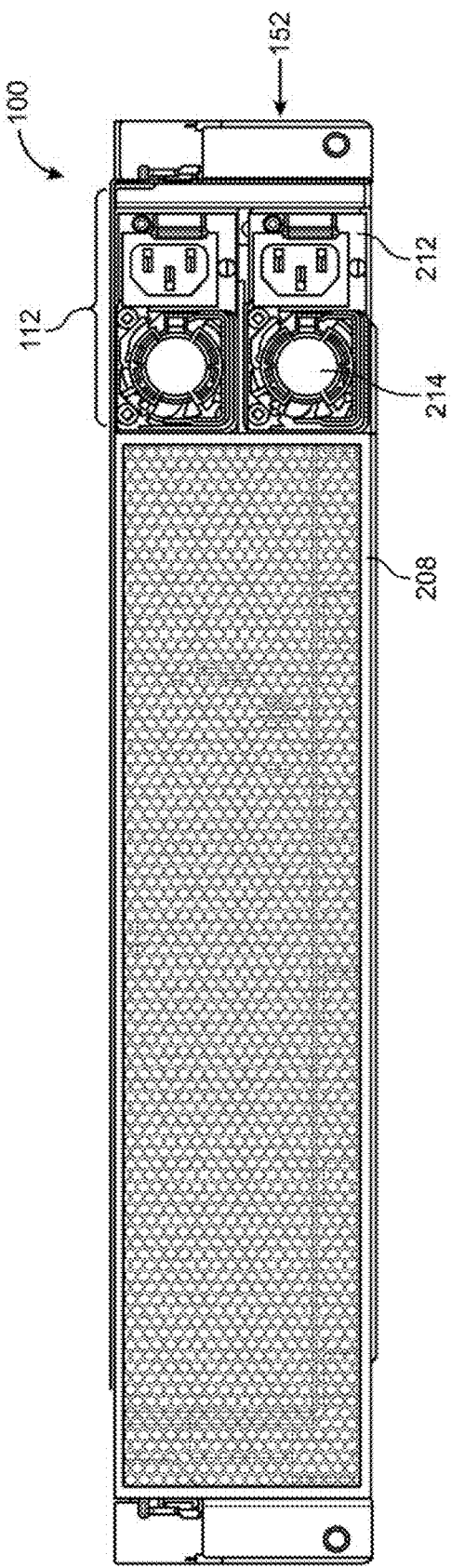
FIG. 6A
FIG. 6B

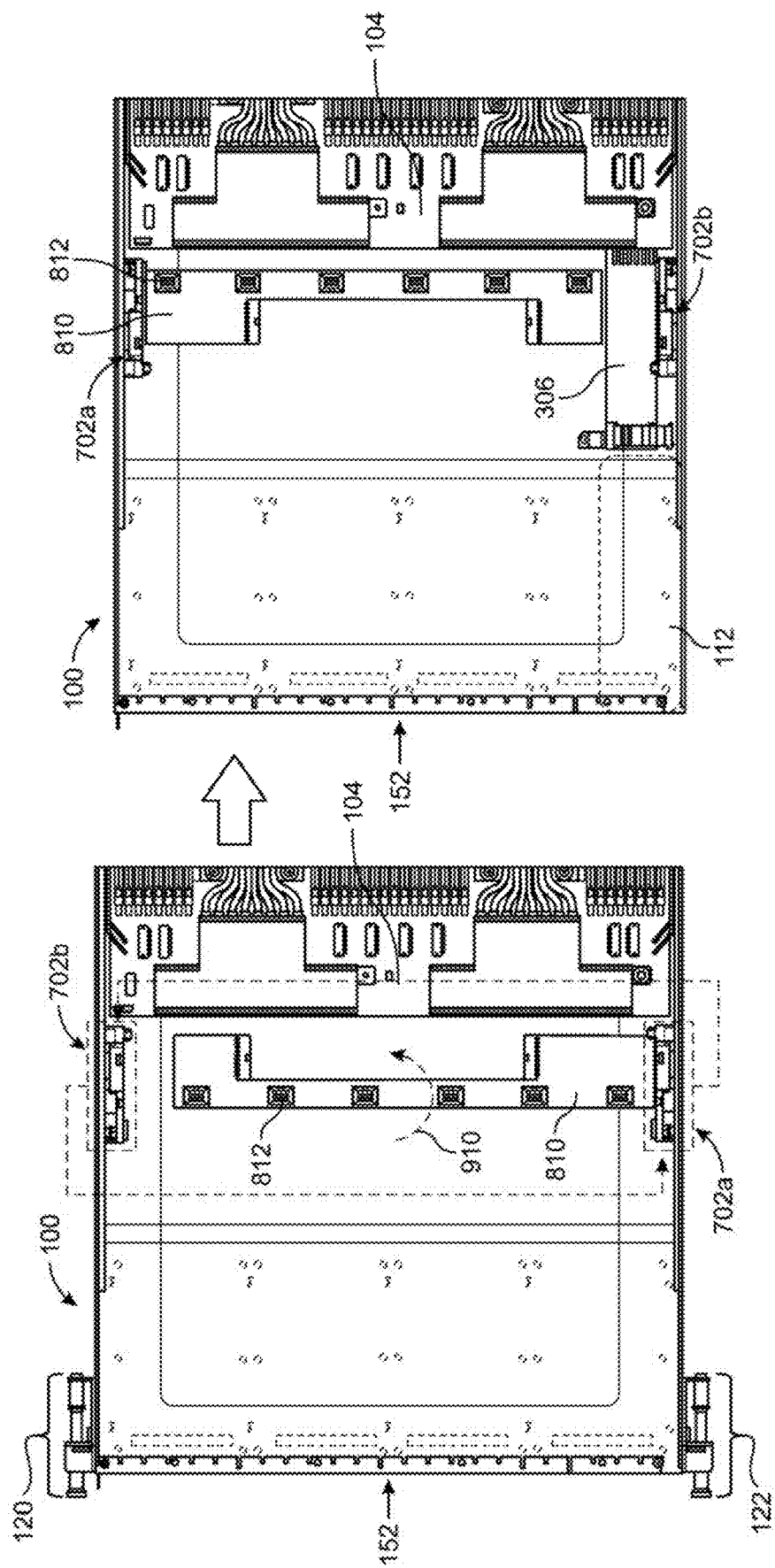

SERVER WITH RECONFIGURABLE FRONT AND REAR ACCESS

CROSS-REFERENCE TO RELATED APPLICATIONS

This patent application claims priority under 35 U.S.C. § 119 to U.S. Provisional Patent Application No. 63/060,411, filed Aug. 3, 2020. The contents of that application in its entirety are hereby incorporated by reference.

TECHNICAL FIELD

The present disclosure relates generally to systems and methods for reconfiguring a server for front access or for rear access.

BACKGROUND

Servers are employed in a large number of applications ranging from high-performance computing to database storage. Servers enable many computing application solutions that have come to be relied upon. For example, servers may support mobile application solutions such as mobile mapping applications, mobile payment systems, text messaging, computation offloading, web browsing, etc. Mobile customers are usually unaware of extensive support being provided by servers in everyday use of their mobile devices. Although mobile customers may not consider server-side support in everyday use of mobile devices, server operators and technicians are tasked to maintain physical and operational health of servers. Thus, servers sometimes need to be physically accessed in order to perform upgrades and/or gain root-level access to make major operating system changes.

In data centers, a server is usually held in a rack structure. The server as such has an orientation that should be maintained when mounting the server in the rack structure. The orientation for mounting is usually fixed, thus limiting flexibility in accessing external physical ports of the server. In addition, airflow within the server is also not reversible, thus discouraging custom reconfiguration of the server to fit individual needs or the orientation of the rack in physical space. Thus, the present disclosure is directed at solving problems related to reconfiguring a server for front or rear access to external physical ports for various purposes.

SUMMARY

Some implementations of the present disclosure provide a method for converting a computing device from a first configuration to a second configuration. A power supply unit of the computing device is moved from a first location at a second end of the computing device to a second location at a first end of the computing device. The power supply unit is rotated such that a power interface of the power supply unit is visible from the first end of the computing device. A set of fans of the computing device is rotated such that airflow direction of the set of fans matches an airflow direction of the power supply unit at the second location.

In an embodiment, a storage cage is installed at the second end of the computing device at a previous location of the power supply unit. In an embodiment, airflow direction within the computing device changes between the first configuration and the second configuration. In an embodiment, in the first configuration, communication ports are provided on the second end of the computing device. In the second configuration, the communication ports are provided on the first end of the computing device.

In an embodiment, bracket assemblies of the computing device are detached from the first end and attached to the second end. The bracket assemblies can include peripheral communication ports. In an embodiment, airflow direction across a motherboard of the computing device changes between the first configuration and the second configuration. In an embodiment, a power linkage board is installed proximate to the second location where the power supply is moved. The power linkage board facilitates power transfer from the power supply unit to a motherboard of the computing device. In an embodiment, mirror image locking elements that secure the set of fans to a chassis of the computing device are interchanged. In an embodiment, the mirror image locking elements include a tab being configured to be situated in a loop of a respective member of the set of fans. In an embodiment, the tab includes an uneven surface with a lower portion and an upper portion. The lower portion facilitates situating the tab in the loop, and the upper portion prevents the loop from disengaging from the tab.

Some implementations of the present disclosure provide a computing device including a chassis with a first end and a second end, a motherboard coupled to the chassis, and a power supply unit including one or more fans. The power supply unit is coupled to the chassis at the second end and is configured to be movable to the first end of the chassis. The computing device further includes a set of fans coupled to the chassis and configured to be rotated such that airflow direction of the set of fans matches airflow direction of the power supply unit.

In an embodiment, the computing device further includes bracket assemblies coupled to the first end of the chassis for mounting the computing device to a rack structure. The bracket assemblies are movable from the first end of the chassis to the second end of the chassis. The bracket assemblies can include peripheral communication ports. In an embodiment, when the power supply unit is at the second end of the chassis, communication ports of the chassis are determined to be at a rear end of the computing device. When the power supply unit is at the first end of the chassis, the communication ports of the chassis are determined to be at a front end of the computing device. The communication ports can be provided on the motherboard. In an embodiment, a riser card is installed on the motherboard such that at least one of the communication ports is provided on the riser card. In an embodiment, the computing device further includes a power linkage board that facilitates power transfer from the power supply unit when the power supply unit is moved to the first end of the chassis. In an embodiment, the computing device further includes mirror image locking elements configured to secure the set of fans to the chassis. In an embodiment, each of the locking elements includes a tab configured to interface with a loop of a respective member of the set of fans.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of embodiments together with reference to the accompanying drawings.

FIG. 2A illustrates a front view of the computing system of FIG. 1.

FIG. 2B illustrates a rear view of the computing system of FIG. 1.

FIG. 6A illustrates a front view of the computing system of FIG. 5.

FIG. 6B illustrates a rear view of the computing system of FIG. 5.

FIG. 9A illustrates steps for rearranging a fan board and locking elements when converting the computing system of FIG. 1 from the first configuration to the second configuration, according to some implementations of the present disclosure.

FIG. 9B illustrates position of the fan board and the locking elements in the second configuration, according to some implementations of the present disclosure.

Figure 1:
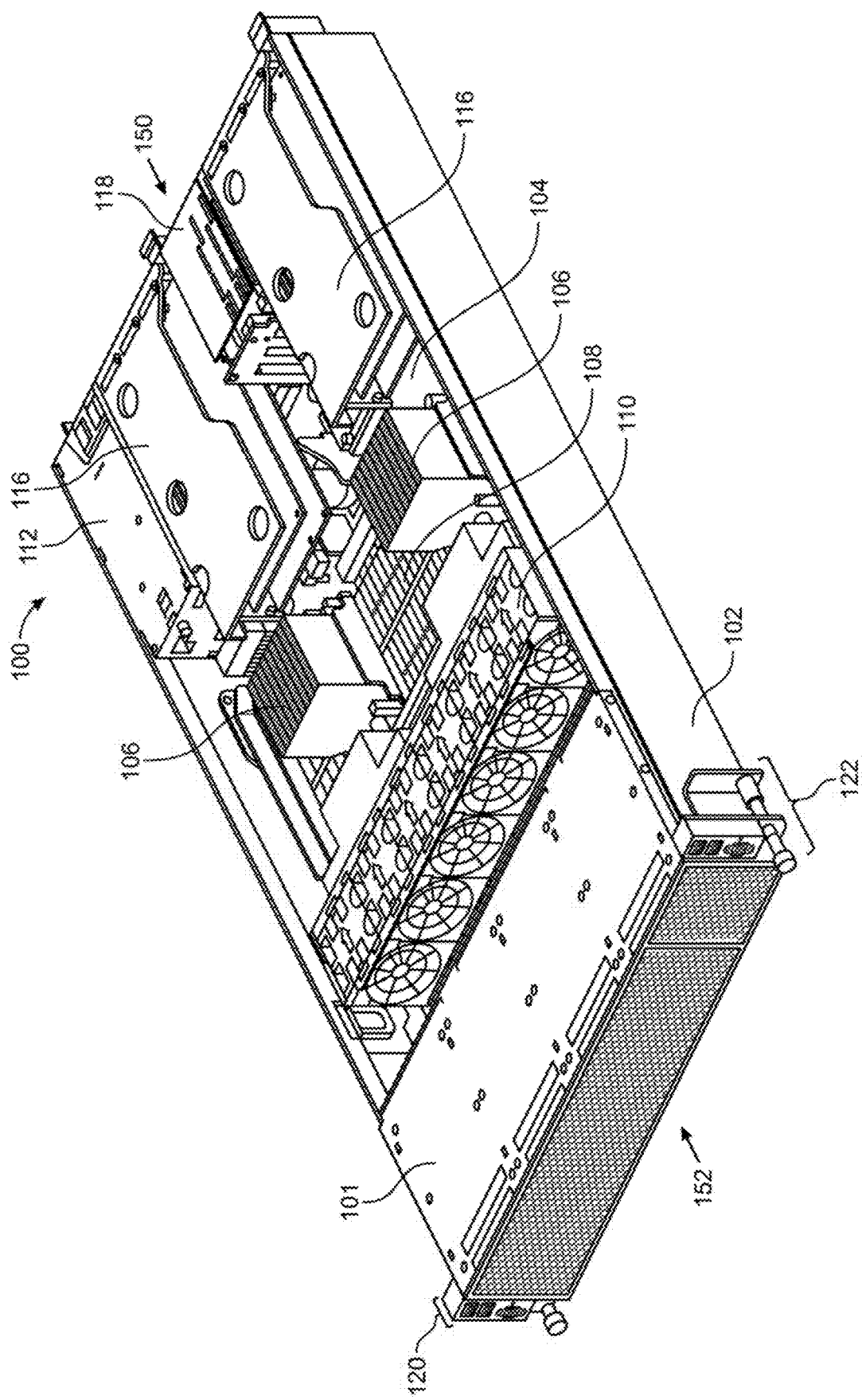
FIG. 1 illustrates a perspective view of a computing system in a first configuration, according to some implementations of the present disclosure.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Embodiments of the present disclosure provide a configurable chassis for use in a computing system that can be reconfigured for either front access or rear access. An advantage of the chassis is being able to maintain airflow direction without having to redesign the chassis or redesign electronic components provided within the chassis. As such, a configurable chassis provided in accordance with embodiments of the present disclosure can achieve a cost effective solution to provide front access or rear access to the computing system.

FIG. 1 illustrates a perspective view of a computing system 100 in a first configuration, according to some implementations of the present disclosure. The computing system 100 can be a server, a desktop computer, etc. The computing system 100 includes a chassis 102 that houses one or more components. The computing system 100 has an orientation in this example, thus defining a first end 152 and an opposite second end 150. The computing system 100 can include a left side bracket assembly 120 and a right side bracket assembly 122 located on opposite sides of the first end 152. The left side bracket assembly 120 and the right side bracket assembly 122 enable the computing system 100 to be mounted to a rack structure. The computing system 100 can include one or more electronic components. The components, for example, may include a motherboard 104, a set of fans 110 forming a fan wall, a power supply unit 112, one or more riser expansion cards 116, and a storage cage 118. The motherboard 104 can include a set of memory slots 108, and processors that are mounted under heat sinks 106. In this example, the memory slots 108 hold dual in-line memory modules (DIMMs). The motherboard 104 can include slots (not shown) for connecting the riser cards 116, via a riser bracket and riser board. The riser cards 116 can provide expansion buses (e.g., PCIe, PCI, AGP, etc.) for connecting other components on the computing system 100.

The chassis 102 can be a metal housing including multiple panels. The multiple panels include vertical and horizontal panels. Some of the one or more components are secured to the horizontal panel of the chassis 102. The computing system 100 can include a cover 101 that partially covers a top portion of the chassis 102. The cover 101 is a flat panel that is secured to the chassis 102. The cover 101 facilitates airflow through the chassis 102 by creating an air tunnel so that air passes underneath the cover 101 in a direction dictated by the set of fans 110. In FIG. 1, the set of fans 110 span the width of the chassis 102, but in some implementations, single fan units may be provided throughout the chassis 102. In some implementations, the set of fans 110 may be positioned under the cover 101.

FIG. 2A illustrates a front view of the computing system 100 of FIG. 1 from the first end 152 when the computing system 100 is in the first configuration. FIG. 2B illustrates a rear view of the computing system 100 of FIG. 1 from the second end 150 when the computing system 100 is in the first configuration. In the first configuration, apart from a set of peripheral ports 206 (FIG. 2A) provided on the bracket assembly 122, the computing system 100 provides no other communication ports when viewed from the first end 152 (FIG. 1). Examples of communication ports include Universal Serial Bus (USB) ports, parallel ports, serial ports, High-Definition Multimedia Interface (HDMI) ports, video graphics array (VGA) ports, optical audio ports, Firewire ports, Ethernet ports, external serial ATA (e-SATA) ports, display ports, mini display ports, etc. From the front view in FIG. 2A, the computing system 100 includes one or more covers 208. The covers 208 can include multiple holes to facilitate airflow. The computing system 100 includes one or more fastening mechanisms 204 for securing the computing system 100 to a rack structure. The computing system 100 can include a power button 202 on the bracket assembly 120 for manually turning ON or turning OFF the computing system 100. Placing the peripheral ports 206 and/or the power button 202 on the bracket assembly 122 and 120, respectively, allows manual power control and at least a minimum set of communication ports to be accessed from the first end 152 (FIG. 1).

In FIG. 2B, the computing system 100 provides access to power interfaces 212 of the power supply unit 112 for providing power to the computing system 100. One or more fans 214 of the power supply unit 112 is provided for dissipating heat generated within the power supply unit 112 and supporting airflow through the computing system 100. The computing system 100 can include one or more communication ports 216. The one or more communication ports 216 can be communication ports of the motherboard 104 (FIG. 1). In some implementations, the one or more communication ports 216 are communication ports from the riser cards 116. Additionally, one or more storage drives 118-1, 118-2, 118-3, 118-4, etc., are accessible from the second end 150 (FIG. 1), as depicted in FIG. 2B. The storage drives 118-1, 118-2, etc., can be removed and installed from the second end 150 shown from the rear view of FIG. 2B.

Since the communication ports 216 and the storage drives 118-1, 118-2, etc., are accessed from the second end 150 (FIG. 1), in the first configuration, the computing system 100 is said to have rear access. That is, when mounted in a rack structure (e.g., a tray structure that slides in and out) the first end 152 (FIG. 1) faces the server technician while the second end 150 (FIG. 1) faces away from the server technician. Therefore, in the first configuration, the first end 152 can be referred to as the "front" end, and the second end 150 can be referred to as the "rear" end. Hence, FIG. 2A is the front view of the computing system 100, and FIG. 2B is the rear view of the computing system 100. Furthermore, it is customary to have power inputs for computing systems at the rear end for cable management purposes. Therefore, location of the power interfaces (e.g., the power interface 212) usually indicates the suggested orientation of computing systems where the end with the power inputs is located at the rear of the rack.

Figure 3A:
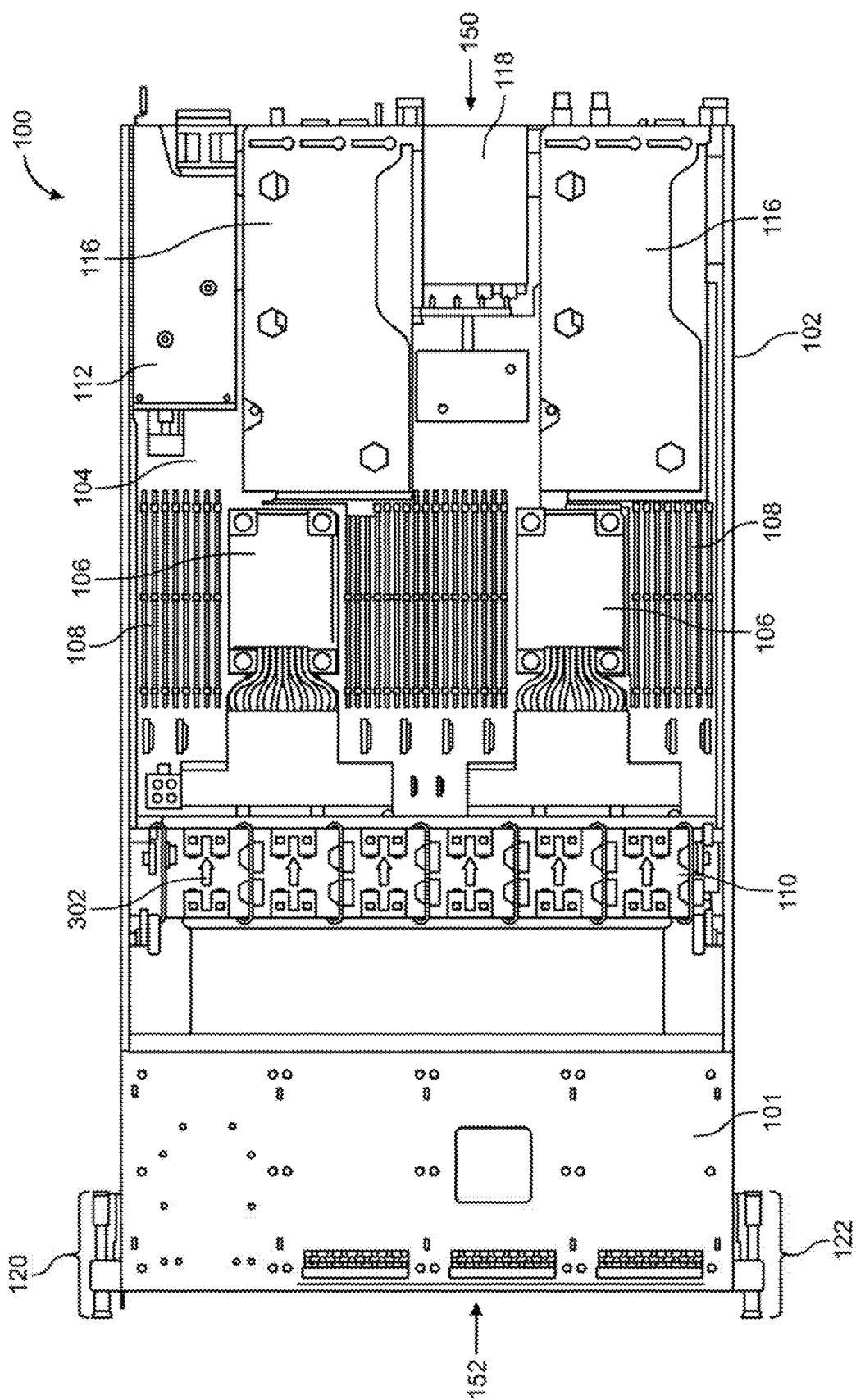
FIG. 3A illustrates a top view of the computing system of FIG. 1 in the first configuration, according to some implementations of the present disclosure.

FIG. 3A illustrates a top view of the computing system 100 of FIG. 1 in the first configuration, according to some implementations of the present disclosure. Like components have been labeled with like reference numbers from their description in relation to FIG. 1. The set of fans 110 include an indication 302 that visually communicates airflow direction dictated by the set of fans 110. For optimal airflow through the computing system 100, the fans 214 (FIG. 2B) of the power supply unit 112 should dictate airflow direction in the same direction as the set of fans 110.

Figure 3B:
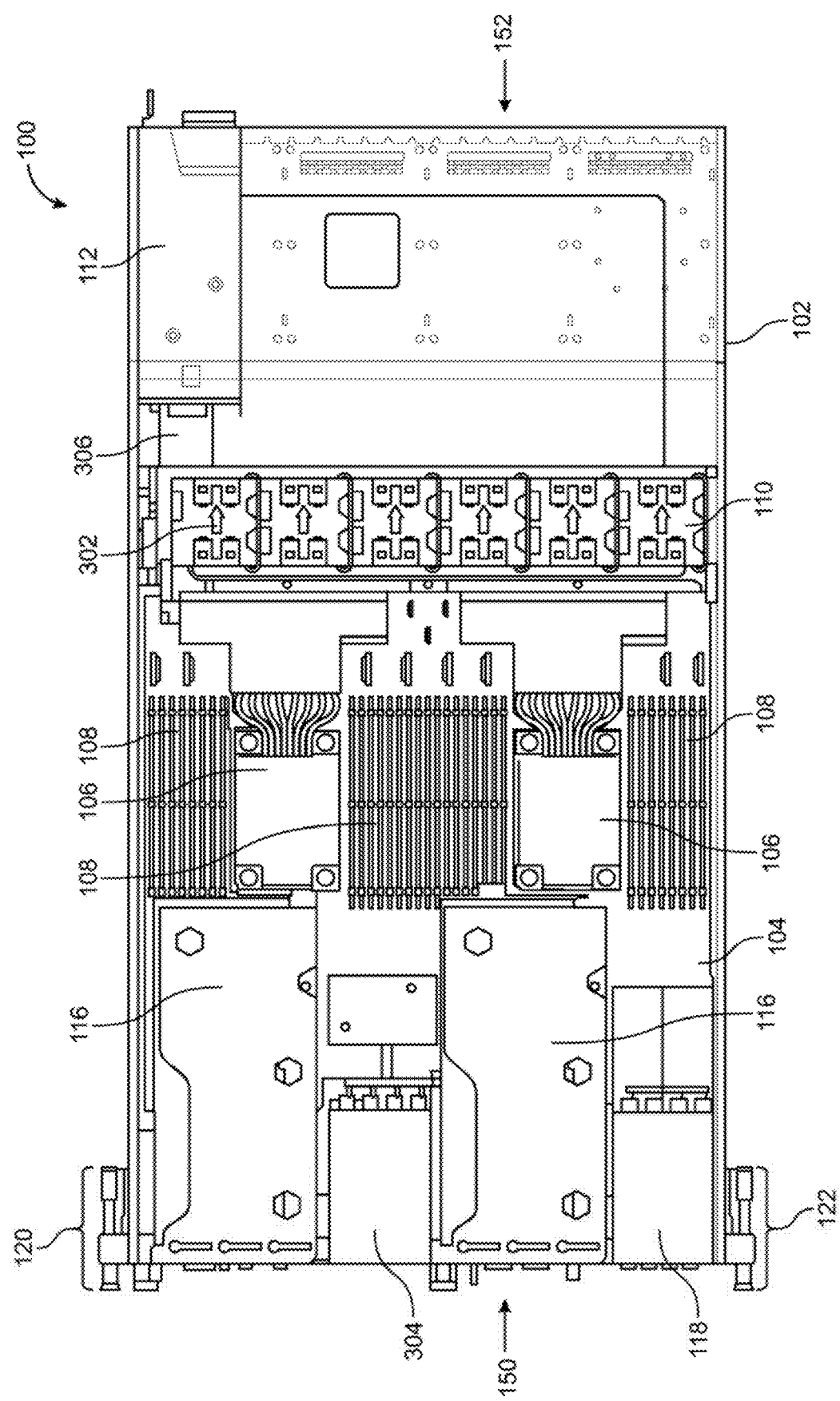
FIG. 3B illustrates a top view of the computing system of FIG. 1 in a second configuration, according to some implementations of the present disclosure.

FIG. 3B illustrates a top view of the computing system 100 in a second configuration, according to some implementations of the present disclosure. Some components in the chassis 102 have been moved to arrange the computing system 100 in the second configuration. In some implementations, components are added to, removed from, or rearranged within the chassis 102. For example, a second storage cage 304 is added to the computing system 100 in FIG. 3B when compared to FIG. 3A. Also, a power linking board 306 for connecting the power supply unit 112 is added in FIG. 3B when compared to FIG. 3A. The power linking board 306 is a printed circuit board. In FIG. 3B, the chassis 102 is rotated (compared to FIG. 3A) to orient the first end 150 at the bottom of the page, and the second end 152 at the top of the page. Note that in the second configuration, the first end 152 corresponds to the rear end, and the second end 150 corresponds to the front end.

Figure 4A:
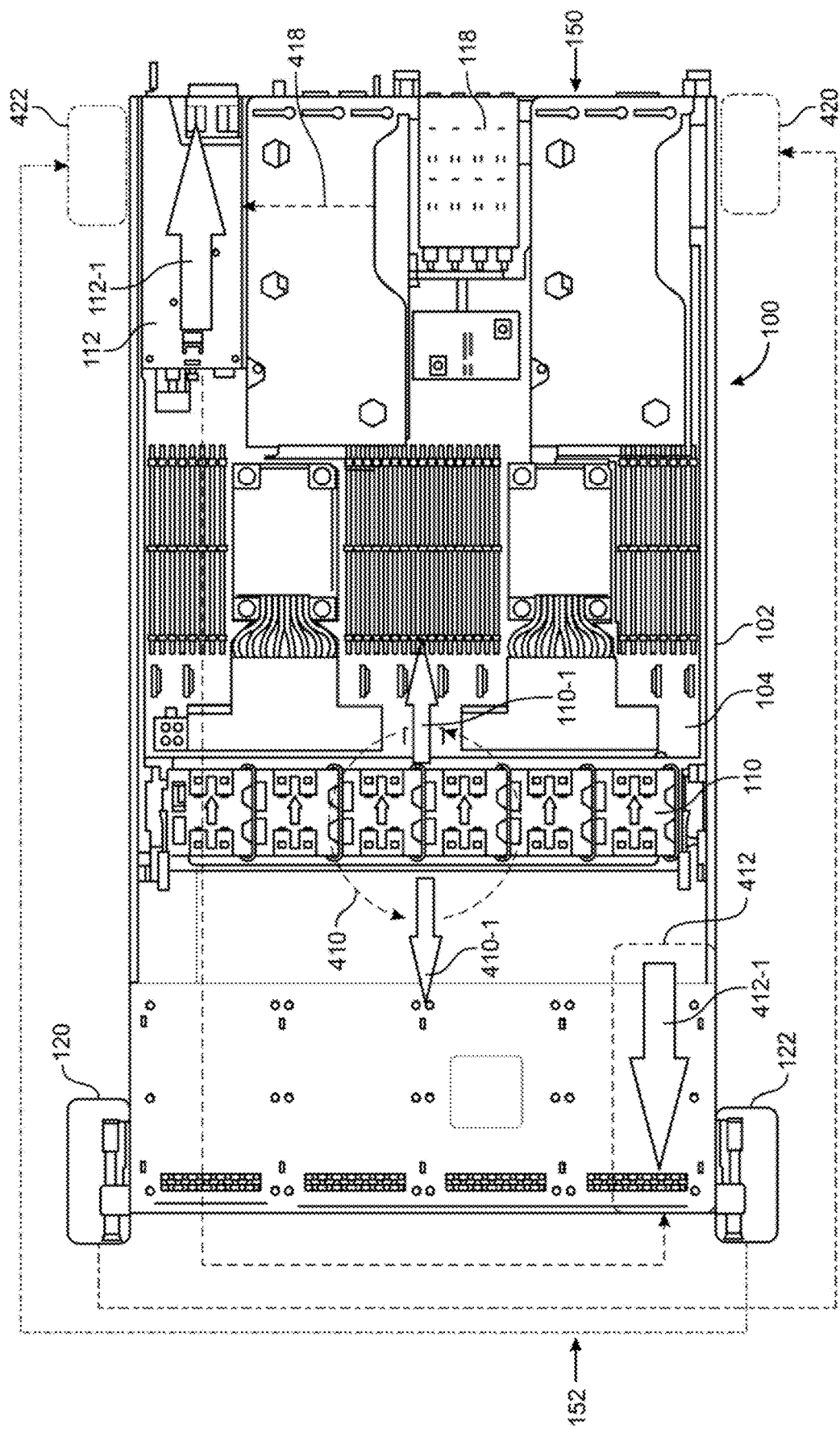
FIG. 4A illustrates steps for converting the computing system of FIG. 1 from the first configuration to the second configuration, according to some implementations of the present disclosure.

FIG. 4A illustrates steps for converting the computing system 100 from the first configuration (FIG. 3A) to the second configuration (FIG. 3B), according to some implementations of the present disclosure. Like components have been labeled with like reference numbers from their description in relation to FIG. 1. Firstly, the left side bracket assembly 120 is moved from the first end 152 of the computing system 100 to a position 420 at the second end 150 of the computing system 100. Similarly, the right side bracket assembly 122 is moved from the first end 152 to a position 422 at the second end 150. The left side bracket assembly 120 and the right side bracket assembly 122 are attached to screw holes provided in the chassis 102. The chassis 102 includes similar screw holes at the first end 152 of the computing system 100 and the second end 150 of the computing system 100 for mounting the left side bracket assembly 120 and the right side bracket assembly 122. Secondly, the power supply unit 112 is moved from the second end 150 to the first end 152. Thirdly, the set of fans 110 is rotated 180 degrees as indicated by the direction 410. Thus, the airflow generated by the set of fans 110 is reversed from the airflow in FIG. 3A. The direction 410 is merely used as an example, a clockwise direction for rotation is also contemplated.

Congruence in airflow between the power supply unit 112 and the set of fans 110 is important in order to maintain cooling efficiency within the computing system 100. In the first configuration, the fans 214 (FIG. 2B) of the power supply unit 112 set airflow in the direction 112-1 in FIG. 4A. The set of fans 110 set airflow in the direction 110-1. Thus, the fans 214 (FIG. 2B) and the set of fans 110 generate airflow in the same direction, driving airflow through the computing system 100 from the first end 152 to the second end 150.

When rearranging components of the computing system 100 to obtain the second configuration, direction of airflow is important. As such, when moving the power supply unit 112 to the position 412 in FIG. 4A, the power supply unit 112 is rotated 180 degrees so that the fans 214 (FIG. 2B) of the power supply unit 112 set airflow in the direction 412-1. Similarly, by rotating the set of fans 110 by 180 degrees in the direction 410, the airflow direction is changed from the direction 110-1 to the direction 410-1.

Figure 4B:
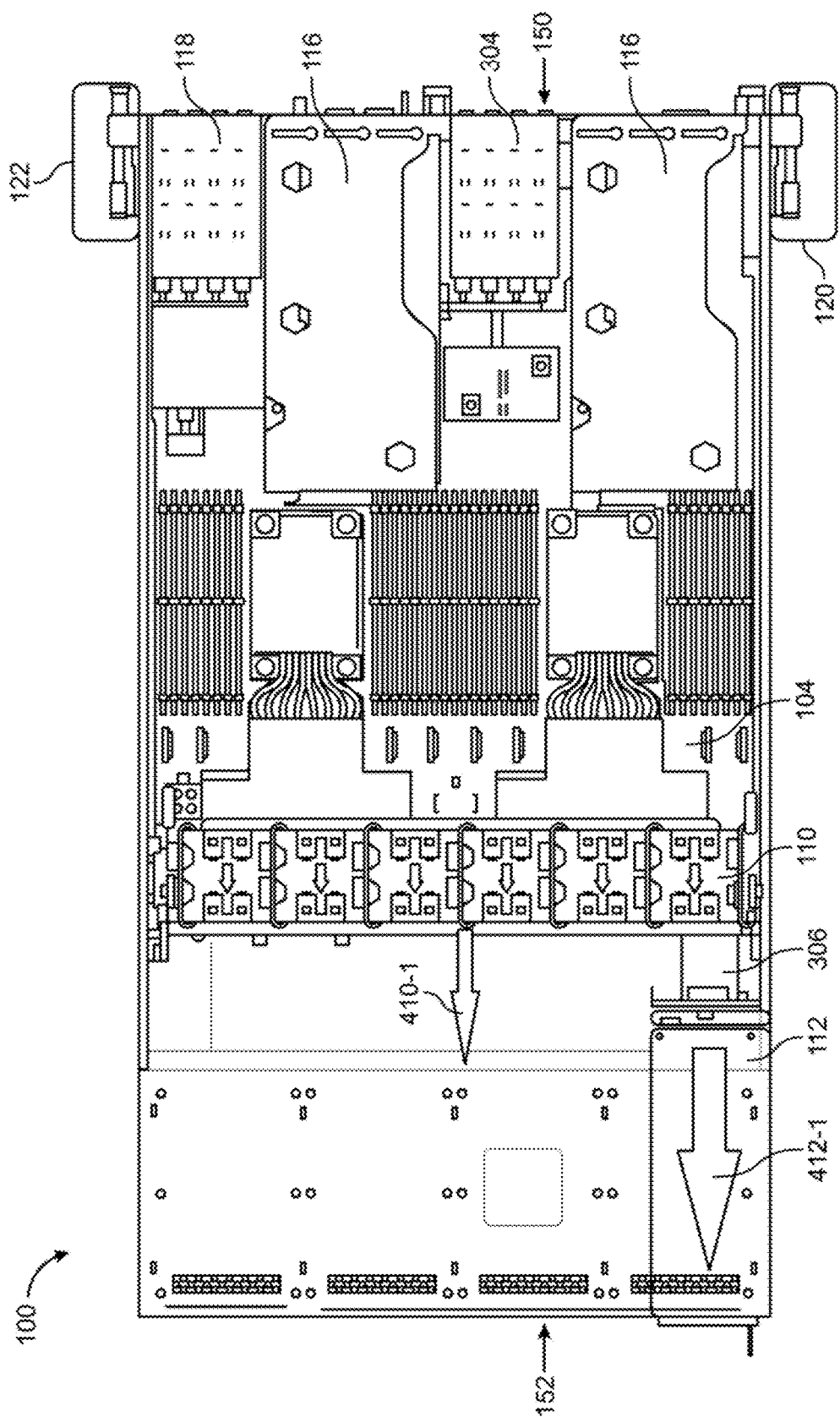
FIG. 4B illustrates airflow direction in the second configuration, according to some implementations of the present disclosure.

FIG. 4B illustrates airflow direction in the computing system 100 when configured in the second configuration, according to some implementations of the present disclosure. The storage cage 118 is moved to the previous location of the power supply unit 112. In some implementations, an additional component or components is added to take advantage of any extra space gained by rearranging components of the computing system 100. The storage cage 304 is added to the computing system 100 to take advantage of any extra space at the second end 150. FIG. 4B is a rotated version of the configuration shown in FIG. 3B. Note that rearranging components in the chassis 102 to move from the first configuration (FIG. 3A) to the second configuration (FIGS. 3B and 4B) has converted the second end 150 from being the rear end of the computing system 100 to being the front end of the computing system 100. Similarly, the first end 152 is converted from being the front end of the computing system 100 to being the rear end of the computing system 100. The power supply unit 112 is provided at the rear end for customary purposes as discussed earlier in connection with FIGS. 2A and 2B.

Figure 5:
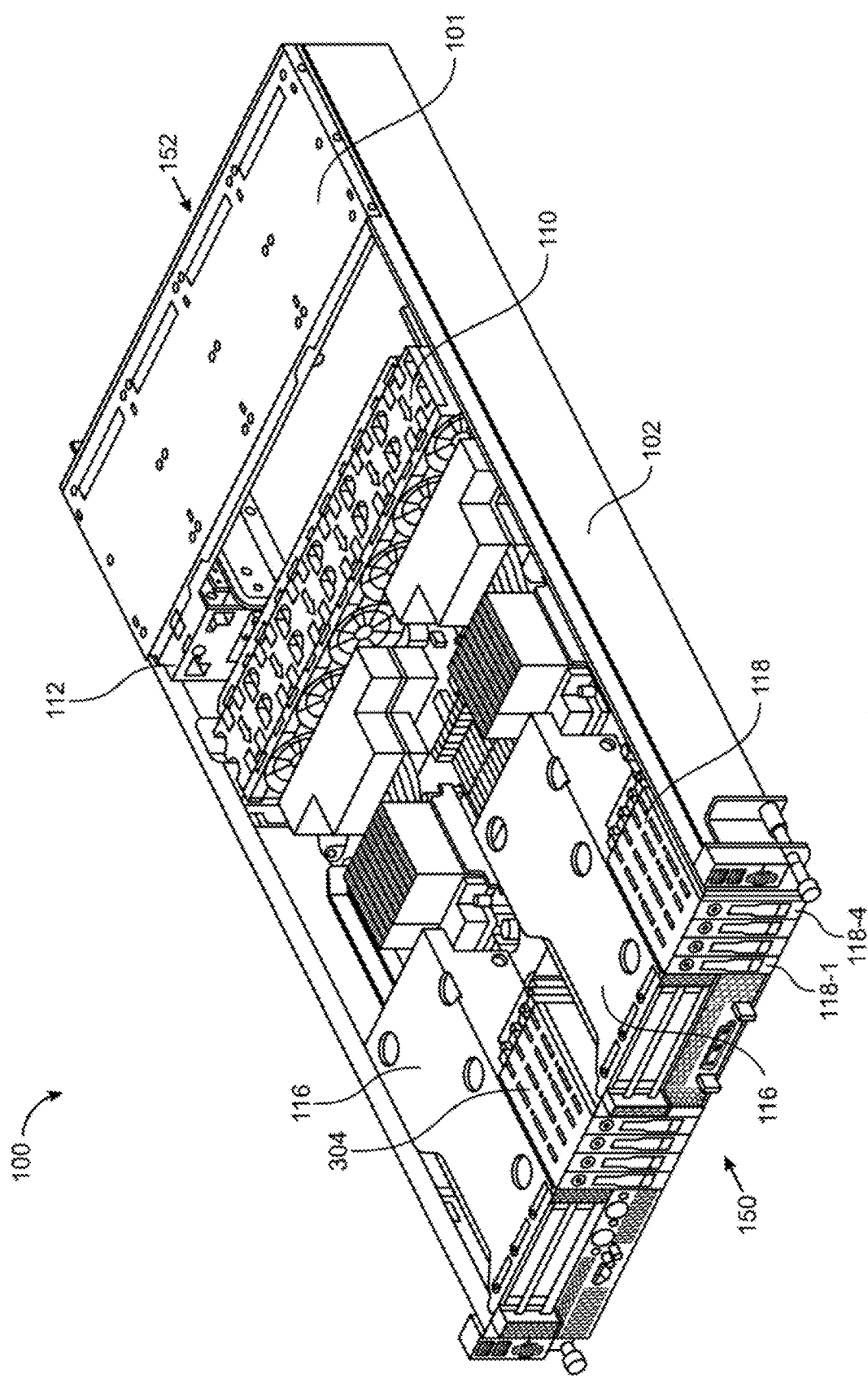
FIG. 5 illustrates a perspective view of the computing system of FIG. 3B in the second configuration, according to some implementations of the present disclosure.

FIG. 5 illustrates a perspective view of the computing system 100 in the second configuration, according to some implementations of the present disclosure. Like components have been labeled with like reference numbers from their description in relation to FIG. 1. The second end 150 is shown to be the front end, and the first end 152 is shown as the rear end. The riser cards 116 and the storage cages 118 and 304 are accessible from the front end. FIG. 6A illustrates a front view of the computing system 100 of FIG. 5, and FIG. 6B illustrates a rear view of the computing system of FIG. 5. Like components have been labeled with like reference numbers from their description in relation to FIG. 1. In FIG. 6A, the peripheral ports 206 and the power button 202 are accessible from the front of the computing device 100. Other communication ports, for example, the communication ports 216 are accessible from the front end. The storage drives 118-1, 118-2, etc. and any storage drives provided in the storage cage 304 are accessible from the front end. In FIG. 6B, the power interfaces 212 are accessible from the rear end.

Embodiments of the present disclosure provide a method for converting a computing system from rear access to front access and vice versa. Rear access indicates that most communication ports and/or component access is at the rear end of the computing system, while front access indicates that most communication ports and/or component access is at the front end of the computing device. FIG. 2A illustrates a front view where only the peripheral ports are accessible from the front end. FIG. 2B illustrates a rear view where other communication ports and devices are accessible from the rear end. On the other hand, FIG. 6A illustrates a front view where peripheral ports and other communication ports and devices are accessible from the front end. FIG. 6B illustrates a rear view where only power interfaces are accessible.

When rearranging components of the computing system 100 to obtain the second configuration (FIG. 3B) from the first configuration (FIG. 3A), movable components can be selected based on ease of installation and removal. For example, when switching from the first configuration (FIG. 3A) to the second configuration (FIG. 3B), the motherboard 104 remains in the same orientation and other components around the motherboard 104 are relocated as illustrated in FIGS. 4A and 4B. The motherboard 104, like most motherboards, can be blocked by other components, increasing difficulty in accessing the motherboard 104. For example, referring to FIG. 3A, the motherboard 104 is partially covered by the riser cards 116 and the power supply unit 112. Thus, in order to move or rotate the motherboard 104, the riser cards 116 have to be removed first. One reason to rotate the motherboard 104 would be to provide connection to the power supply unit 112 in the second configuration of FIG. 3B. An easier solution, instead, is to provide the power linking board 306 to connect the power supply unit 112 to the motherboard 104, when in the second configuration.

Rotated and/or moved components should have access to the motherboard 104 for power and/or communication. The power linking board 306 is added to connect the power supply unit 112 and the motherboard 104. In some implementations, the bracket assemblies 120, 122 (FIG. 4A) can be connected using internal wires to internal ports of the motherboard 104. In some implementations, the set of fans 110 can be connected using internal wires to internal ports of the motherboard 104.

Figure 7A:
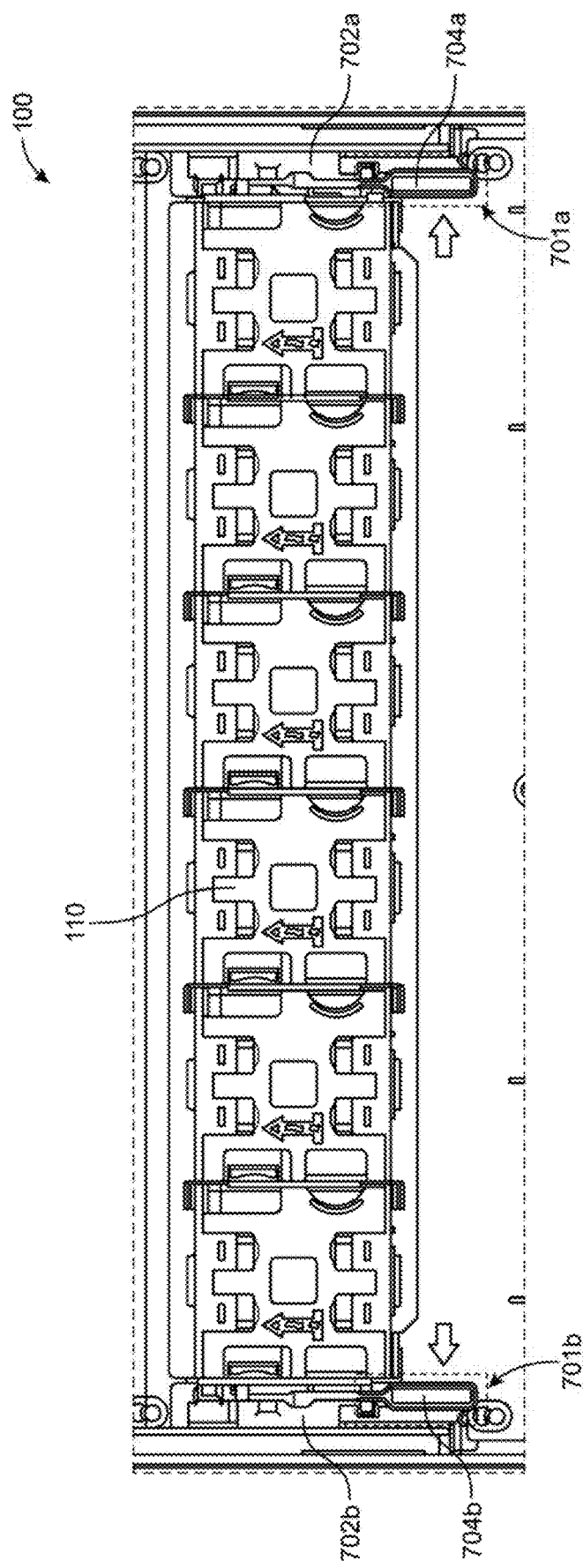
FIG. 7A illustrates a portion of the computing system of FIG. 1, according to some implementations of the present disclosure.

In some implementations, similar to the power linking board 306 (FIG. 3B), printed circuit boards can be used to connect moved and/or rotated components and the motherboard 104. For example, FIG. 7A illustrates a portion of the computing system 100 of FIG. 1 with the set of fans 110 in the first configuration, according to some implementations of the present disclosure. Like components have been labeled with like reference numbers from their description in relation to FIG. 1. The set of fans 110 is secured to the chassis 102 using locking elements 702a, 702b. The locking elements 702a, 702b interface with members 701a, and 701b of the set of fans 110. The members 701a, 701b have recessed flat tops 704a, 704b.

Figure 7B:
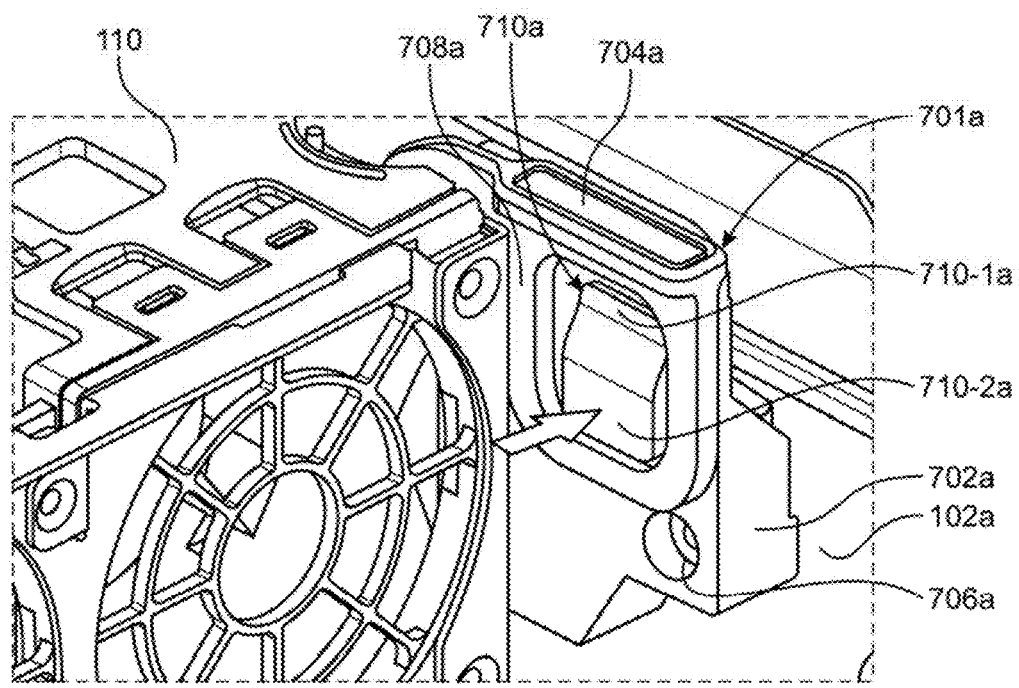
FIG. 7B illustrates a perspective view of a first member interfaced with a first locking element, according to some implementations of the present disclosure.

FIG. 7B illustrates a perspective view of the member 701a interfaced with the locking element 702a, according to some implementations of the present disclosure. The locking element 702a is attached to an inner surface 102a of the chassis 102 using, for example, one or more screw holes 706a. The recessed flat top 704a of the member 701a is surrounded by edges such that gripping the member 701a to disengage from the locking element 702a is made easier. The member 701a includes a vertical loop 708a for receiving a tab 710a of the locking element 702a. The vertical loop 708a is orthogonal to the recessed flat top 704a. When the tab 710a is received by the vertical loop 708a, the set of fans 110 is secured to the locking element 702a. The tab 710a includes an uneven surface with a lower portion 710-1a of the uneven surface transitioning to an upper portion 710-2a of the uneven surface. When the tab 710a is received by the vertical loop 708a, height of the upper portion 710-2a with respect to a thickness of the vertical loop 708a prevents the member 701a from sliding.

Figure 7C:
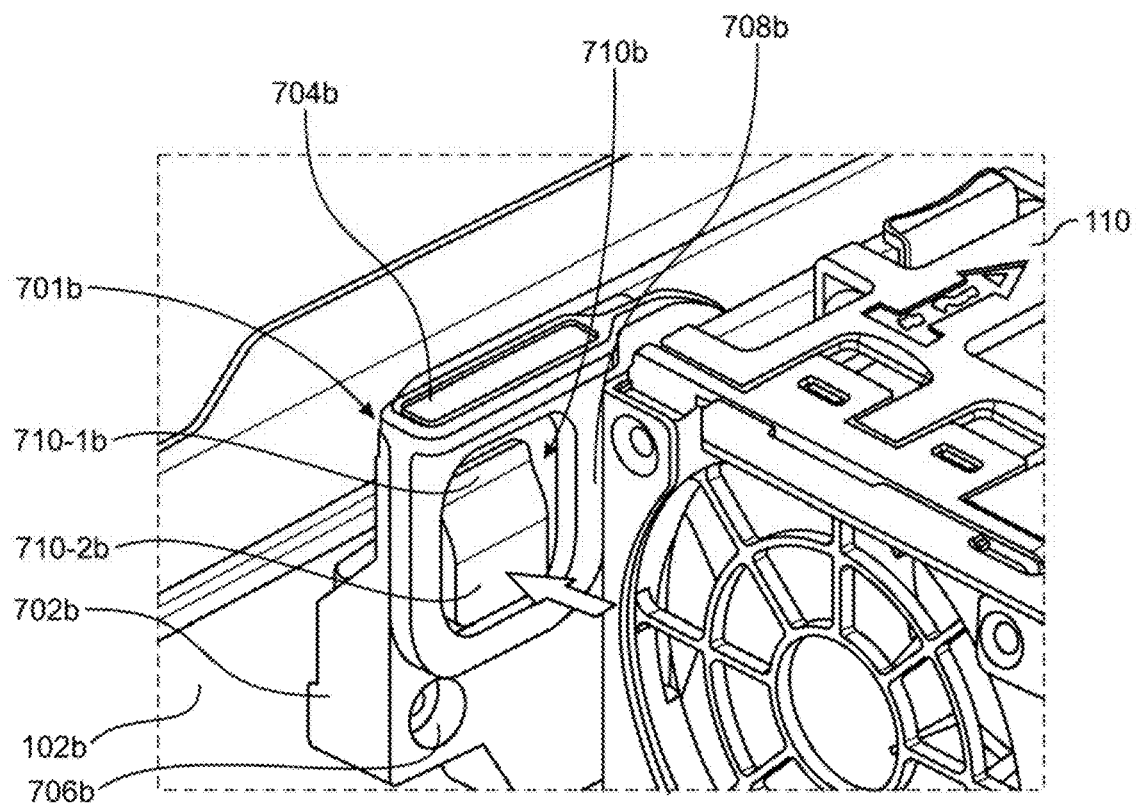
FIG. 7C illustrates a perspective view of a second member interfaced with a second locking element, according to some implementations of the present disclosure.

Similar to FIG. 7B, FIG. 7C illustrates a perspective view of the member 701b interfaced with the locking element 702b, according to some implementations of the present disclosure. The locking element 702b is a mirror image of the locking element 702a (FIG. 7B). The locking element 702b includes a tab 710b with an uneven surface with a lower portion 710-1b and an upper portion 710-2b, similar to the tab 710a (FIG. 7B). The tab 710b interfaces with a vertical loop 708b of the member 701b in a similar manner as discussed above with respect to the tab 710a (FIG. 7B) and the vertical loop 708a (FIG. 7B). The locking element 702b is attached to an inner surface 102b of the chassis 102 using screw holes 706b. The inner surface 102b is opposite the inner surface 102a (FIG. 7B).

Figure 8:
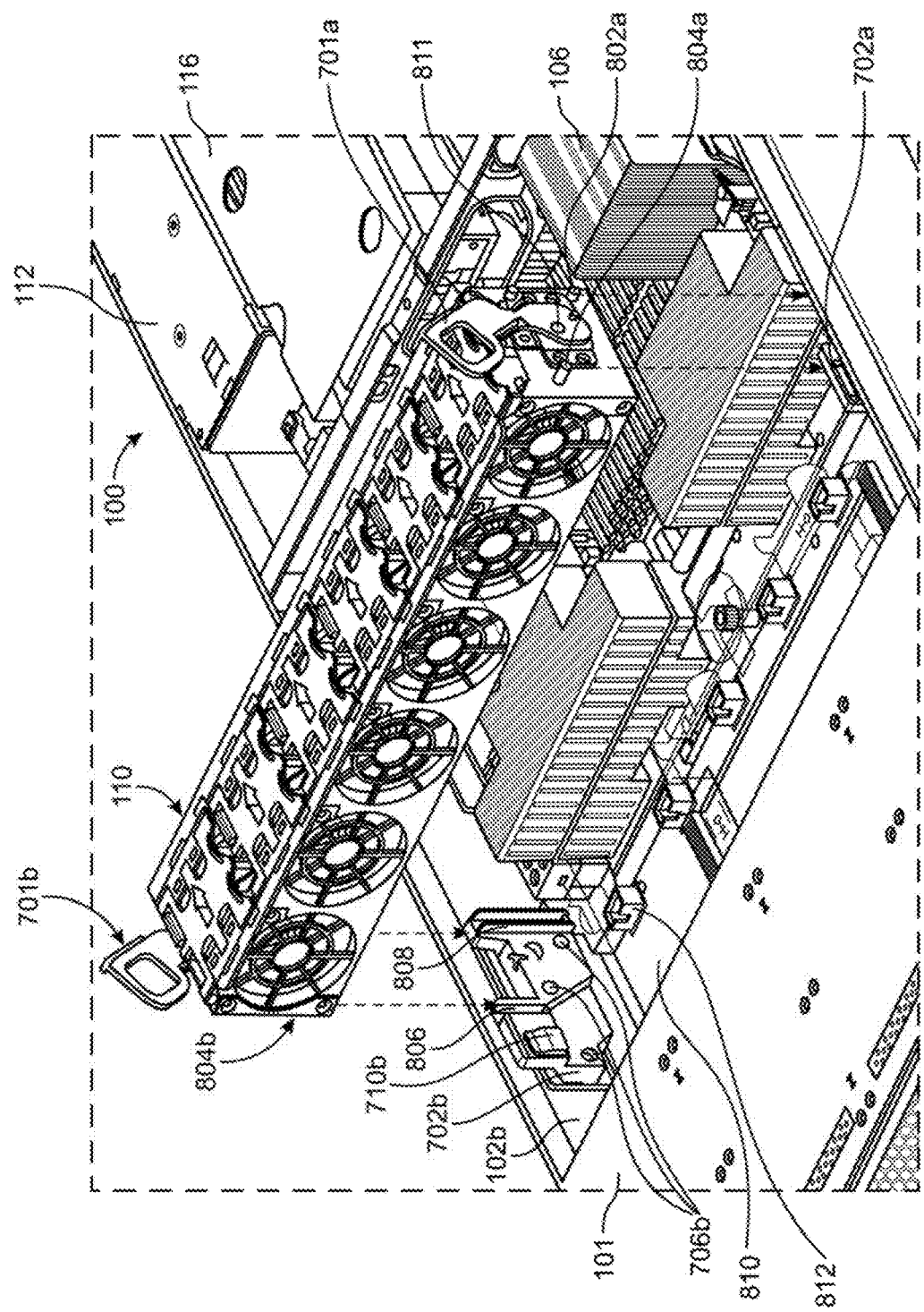
FIG. 8 illustrates installing a set of fans in the computing system of FIG. 1, according to some implementations of the present disclosure.

FIG. 8 illustrates installing the set of fans 110 in the computing system 100, according to some implementations of the present disclosure. The set of fans 110 can include one or more guides that interface with the locking elements 702a, 702b. On a first side, the one or more guides include a first set of guides 802a and a second set of guides 804a. FIG. 8 shows two guides in the first set of guides 802a and one guide in the second set of guides 804a. Similarly, on a second side (not shown), the one or more guides include a third set of guides (not shown) that are similar to the first set of guides 802a and a fourth set of guides 804b that are similar to the second set of guides 804a. The one or more guides are aligned with grooves on the locking elements 702a, 702b as shown in FIG. 8. For example, grooves 806, 808 of the locking element 702b are configured to receive the fourth set of guides 804b and the third set of guides (not shown).

To remove the set of fans 110 from the computing system 100, the members 701a, 701b are rotated to the positions depicted in FIG. 8. The member 710a rotates about a pivot point 811. Removing the set of fans 110 exposes a fan board 810 with connectors 812 for interfacing with the set of fans 110. The fan board 810 can be connected to the motherboard 104 (FIG. 3A) to facilitate signal and power communication between the set of fans 110 and the motherboard 104 (FIG. 3A). Installing the set of fans 110 on the fan board 810 includes positioning the set of fans 110 such that the one or more guides of the set of fans 110 is aligned with the one or more grooves. Then the members 701a, 701b are rotated such that the members 701a, 701b receive the tabs 710a, 710b as illustrated in FIGS. 7B and 7C.

FIG. 9A illustrates steps for rearranging the fan board 810 and the locking elements 702a, 702b when converting the computing system of FIG. 1 from the first configuration to the second configuration, according to some implementations of the present disclosure. The locking element 702a is interchanged with the locking element 702b. The fan board 810 is rotated 180 degrees in a counterclockwise direction 910. FIG. 9B illustrates positioning of the fan board 810, the power linkage board 306, and the locking elements 702a, 702b in the second configuration, according to some implementations of the present disclosure. In the second configuration, the power linkage board 306 facilitates connecting the power supply unit 112 to the motherboard 104.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A method for converting a computing device from a first configuration to a second configuration, comprising:
   moving a power supply unit of the computing device from a first location at a second end of the computing device to a second location at a first end of the computing device;
   rotating the power supply unit such that a power interface of the power supply unit is visible from the first end of the computing device;
   rotating a set of fans of the computing device such that airflow direction of the set of fans matches an airflow direction of the power supply unit at the second location;
   detaching bracket assemblies of the computing device from the first end;
   attaching the bracket assemblies on the second end; and
   interchanging mirror image locking elements that secure the set of fans to a chassis of the computing device, wherein each of the locking elements includes a tab being configured to be situated in a loop of a respective member of the set of fans.

2. The method of claim 1, further comprising:
   installing a storage cage at the second end of the computing device at a previous location of the power supply unit.

3. The method of claim 1, wherein an airflow direction within the computing device changes between the first configuration and the second configuration.

4. The method of claim 1, wherein in the first configuration, communication ports are provided on the second end of the computing device and in the second configuration, the communication ports are provided on the first end of the computing device.

5. The method of claim 1, wherein the bracket assemblies include peripheral communication ports.

6. The method of claim 1, wherein airflow direction across a motherboard of the computing device changes between the first configuration and the second configuration.

7. The method of claim 1, further comprising:
   installing a power linkage board proximate to the second location where the power supply unit is moved, the power linkage board facilitating power transfer from the power supply unit to a motherboard of the computing device.

8. The method of claim 1, wherein the tab includes an uneven surface with a lower portion and an upper portion, the lower portion facilitating situating the tab in the loop, and the upper portion preventing the loop from disengaging from the tab.

9. A computing device, comprising:
a chassis with a first end and a second end;
a motherboard coupled to the chassis;
a power supply unit including one or more fans and coupled to the chassis at the second end, the power supply unit being configured to be movable to the first end of the chassis;
a set of fans coupled to the chassis and configured to be rotated such that airflow direction of the set of fans matches airflow direction of the power supply unit;
bracket assemblies coupled to the first end of the chassis for mounting the computing device to a rack structure, the bracket assemblies being movable from the first end of the chassis to the second end of the chassis; and
mirror image locking elements configured to secure the set of fans to the chassis, wherein each of the locking elements includes a tab configured to interface with a loop of a respective member of the set of fans.

10. The computing device of claim 9, wherein the bracket assemblies include peripheral communication ports.

11. The computing device of claim 9, wherein when the power supply unit is at the second end of the chassis, communication ports of the chassis are determined to be at a rear end of the computing device, and when the power supply unit is at the first end of the chassis, the communication ports of the chassis are determined to be at a front end of the computing device.

12. The computing device of claim 11, wherein the communication ports are provided on the motherboard.

13. The computing device of claim 12, wherein a riser card is installed on the motherboard such that at least one of the communication ports is provided on the riser card.

14. The computing device of claim 9, further comprising:
a power linkage board facilitating power transfer from the power supply unit when the power supply unit is moved to the first end of the chassis.

* * * * *